United States Patent [19]

Campbell, Jr.

[11] Patent Number: 4,520,347
[45] Date of Patent: May 28, 1985

[54] CODE CONVERSION CIRCUIT

[75] Inventor: Jules D. Campbell, Jr., Austin, Tex.

[73] Assignee: Motorola, Inc., Schaumburg, Ill.

[21] Appl. No.: 443,352

[22] Filed: Nov. 22, 1982

[51] Int. Cl.³ .......................................... H03K 13/24
[52] U.S. Cl. .............................. 340/347 DD; 235/310; 377/41
[58] Field of Search ............... 340/347 DD; 235/310, 235/311; 377/41; 364/786, 787, 788

[56] References Cited

U.S. PATENT DOCUMENTS 3,949,299 4/1976 Song ........................... 340/347 DD
4,087,754 5/1978 Song ........................... 340/347 DD Primary Examiner—Charles D. Miller
Attorney, Agent, or Firm—Anthony J. Sarli, Jr.; Jeffrey Van Myers; Robert L. King

[57] ABSTRACT

A code conversion circuit comprising logic for converting an n-bit binary number having a sign bit in two's complement code to sign-magnitude code is provided where n is an integer. The logic identifies whether or not the binary number is positive or negative. Regardless of polarity, the sign bit and least significant bit are directly outputted. If the binary number is positive, all bits are outputted with unchanged logic states. If the binary number is negative, the least significant bit of the n magnitude bits which has a logic one value is identified. The remaining n magnitude bits of higher significance are inverted and outputted with the other magnitude bits.

8 Claims, 2 Drawing Figures

CODE CONVERSION CIRCUIT

TECHNICAL FIELD

This invention relates generally to code conversion circuits and, more particularly, to a circuit for converting data in two's complement code to sign-magnitude code.

BACKGROUND ART

In performing a digital to analog conversion utilizing switched capacitors, a discontinuity which is typically referred to as offset error may occur when transitioning between positive and negative numbers. Offset errors are caused, in part, from voltage errors associated with a digital to analog converter (DAC) structure. Such offset errors are very undesirable for DACs utilized in speech applications because offset error may introduce harmonic frequencies that drastically affect the quality of sound. Other errors associated with a DAC structure, such as gain and nonlinearity errors, are not as critical in speech applications and may be compensated otherwise.

Various codes and conversions exist in the D/A and A/D conversion art. Well known bipolar codes which represent analog signals of two polarities are sign-magnitude, two's complement, one's complement and offset binary codes. For bipolar (i.e. two polarities) applications, two's complement, one's complement and offset binary have disadvantages which produce errors when transitioning at the zero level between negative and positive numbers. In both two's complement and offset binary code, a major bit transition occurs at zero which can produce offset and linearity problems. One's complement code has an ambiguous zero because zero is represented by either all zeroes or all ones. Further, one's complement code is not as easily implemented as two's complement code. The sign-magnitude code is the only well known code in which the magnitude bits do not experience a major transition at zero. Sign-magnitude also has an ambiguous zero which typically requires additional software or hardware to resolve. However, this disadvantage is outweighed by the advantage which sign-magnitude code has over the other well-known codes at zero. Therefore, others have used code conversion circuits to convert from two's complement code to sign-magnitude code. When converting from two's complement code to sign-magnitude code, others have used software programs or a direct hardware circuit requiring multiple clock cycles.

SUMMARY OF THE INVENTION

Accordingly, it is an object of the present invention to provide an improved code conversion circuit.

Another object of the invention is to provide an improved circuit for converting data in two's complement form to sign-magnitude form.

Yet another object of the invention is to provide a method of converting a binary number in two's complement code to sign-magnitude code within one clock cycle of a system clock of predetermined frequency.

In carrying out the above and other objects of the present invention, there is provided, in one form, logic means for converting an n-bit binary number containing a sign bit and n−1 magnitude bits in two's complement code to sign-magnitude code where n is an integer. The logic means couple the sign bit and least significant magnitude bit to an output for providing the sign bit and least significant magnitude bit of the binary number in sign-magnitude code regardless of whether the binary number is positive or negative. If the sign bit indicates a positive number, all magnitude bits are coupled to an output terminal in their present logic state. If the sign bit indicates a negative number, the logic means identify the least significant bit of a negative binary number which has a logic one value and invert the remainder of the n−1 magnitude bits of higher significance. For negative numbers, the logic value of the least significant bit having a logic one value and all bits of lower significance are not inverted. The least significant magnitude bit having a logic one value, any magnitude bits of lower significance, and the inverted magnitude bits are then coupled to the output as the remaining magnitude bits of the binary word which has been converted to sign-magnitude code.

The above and other objects, features and advantages of the present invention will be more clearly understood from the following detailed description taken in conjunction with the accompanying drawings.

DESCRIPTION OF THE PREFERRED EMBODIMENT

Figure 1:
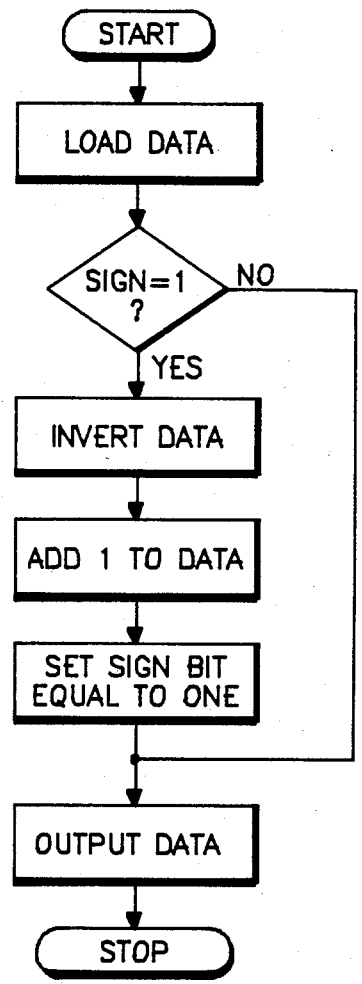
FIG. 1 illustrates in block diagram form a flowchart for a software code conversion of a binary number from two's complement code to sign-magnitude code.

Shown in FIG. 1 is a block diagram of a software implementation for converting a binary number in two's complement code to sign-magnitude code. After a binary data word has been loaded and stored by a register, a sign bit of the binary number is checked for whether or not the logic value is a logic one. If the logic value of the sign bit is a logic zero indicating a positive number, the data is outputted in sign-magnitude code with an unchanged sign bit and unchanged magnitude bits. If the logic value of the sign bit is a logic one indicating a negative number, the logic value of all bits of the data is inverted. A logic one is added to the data and the logic value of the sign bit is set to one. In this form, the data has been converted by the software program from two's complement code to sign-magnitude code.

Figure 2:
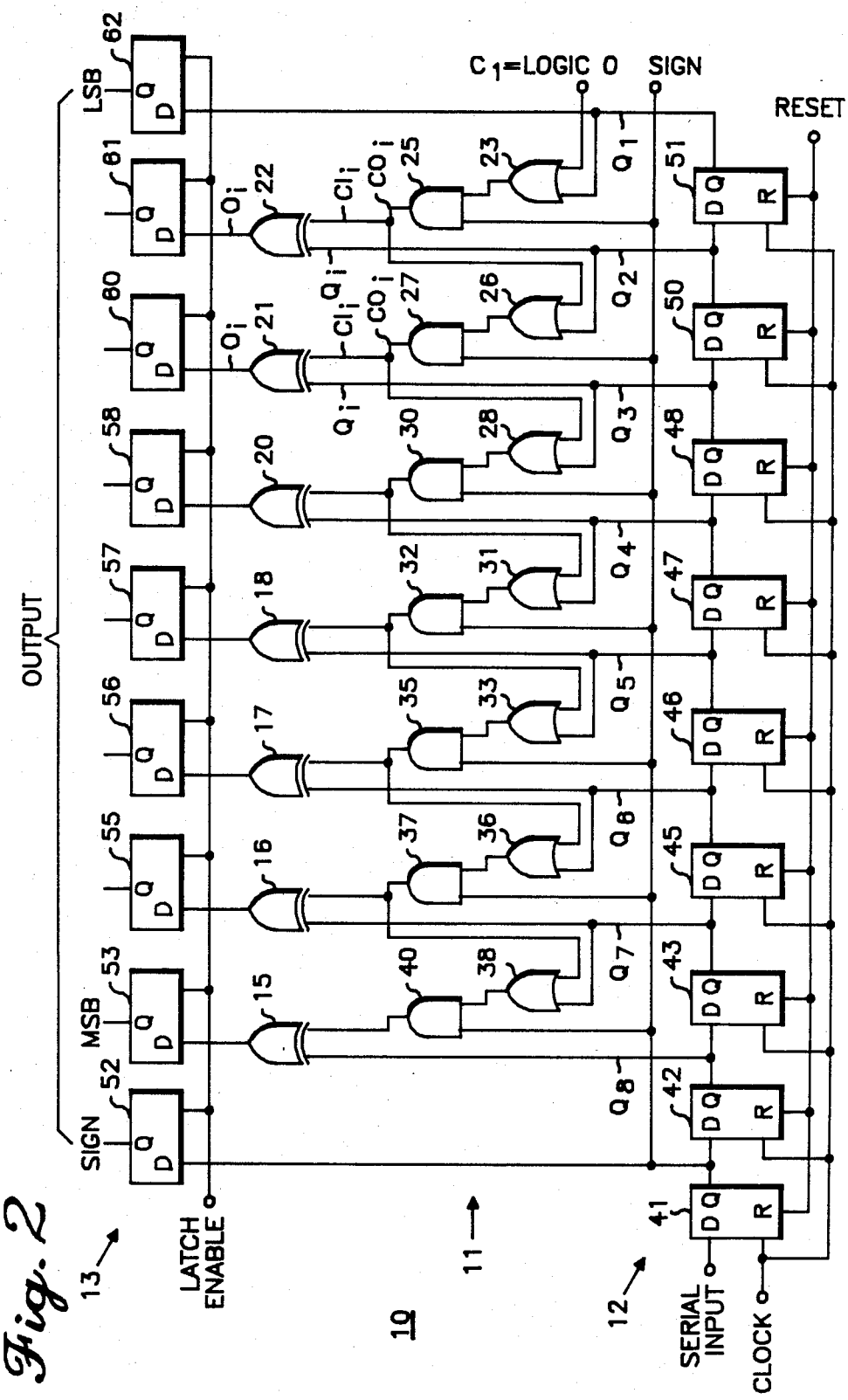
FIG. 2 illustrates in logic diagram form a code conversion circuit in accordance with a preferred embodiment of the present invention.

Shown in FIG. 2 is a code conversion circuit 10 comprising a logic means portion 11, an input portion 12 and an output portion 13. For the purpose of illustration only, conversion of a nine bit binary number having a sign bit and eight magnitude bits is shown although code conversion circuit 10 may be used for conversion of a binary number having any integer number of magnitude bits. Logic means portion 11 comprises a rank ordered plurality of logic gates comprising an exclusive OR gate 15 of highest rank and exclusive OR gates 16, 17, 18, 20, 21 and 22 of descending rank, respectively. An OR gate 23 has an output coupled to a first input of an AND gate 25 which has an output $CO_i$ which is a carry out (CO) output. The value of i varies from 1 to n−1 where n−1 is an integer and is the number of magnitude bits in an input binary number in two's complement code which is to be converted to sign-magnitude code. OR gate 23 has a first or carry in input ($C_i$) coupled to a zero logic level and has a second or data input $Q_1$ coupled to the least significant bit (LSB) of an input binary word in two's complement code. A second input of AND gate 25 is coupled to the sign bit of the input binary number in two's complement code. The carry out output of AND gate 25 is coupled to both a first or a carry in (CI$_i$) input of exclusive OR gate 22 and to a first input of an OR gate 26. A second input of OR gate 26 is coupled to both a data input Q$_2$ and a second input of exclusive OR gate 22. An output of OR gate 26 is coupled to a first input of an AND gate 27. A second input of AND gate 27 is coupled to the sign bit of the input binary number, and an output of AND gate 27 is coupled to both a first input of exclusive OR gate 21 and a first input of OR gate 28. A second input of exclusive OR gate 21 is coupled to both a second input of OR gate 28 and to a data input Q$_3$. An output of OR gate 28 is coupled to a first input of an AND gate 30 which has a second input coupled to the sign bit of the input binary number. An output of AND gate 30 is coupled to a first input of exclusive OR gate 20 and to a first input of an OR gate 31. A second input of OR gate 31 is coupled to both a second input of exclusive OR gate 20 and a data input Q$_4$. An output of OR gate 31 is coupled to a first input of an AND gate 32 which has a second input coupled to the sign bit of the input binary number. An output of AND gate 32 is coupled to both a first input of exclusive OR gate 18 and a first input of an OR gate 33. A second input of OR gate 33 is coupled to both a second input of exclusive OR gate 18 and to a data input Q$_5$. An output of OR gate 33 is coupled to a first input of an AND gate 35 which has a second input coupled to the sign bit of the input binary number. An output of AND gate 35 is coupled to both a first input of exclusive OR gate 17 and to a first input of OR gate 36. A second input of OR gate 36 is coupled to both a second input of exclusive OR gate 17 and to a data input Q$_6$. An output of OR gate 36 is coupled to a first input of an AND gate 37 which has a second input coupled to the sign bit of the input binary number. An output of AND gate 37 is coupled to both a first input of an exclusive OR gate 16 and to a first input of an OR gate 38. A second input of OR gate 38 is coupled to both a second input of exclusive OR gate 16 and to a data input Q$_7$. An output of OR gate 38 is coupled to a first input of AND gate 40, and a second input of AND gate 40 is coupled to the sign bit of the input binary number. An output of AND gate 40 is coupled to a first input of exclusive OR gate 15 which has a second input coupled to a data input Q$_8$.

Input portion 12 comprises a rank ordered plurality of n−1 flip flops corresponding to each magnitude bit of the n-bit input binary number, where n is an integer, and an additional flip corresponding to a sign bit associated with the input binary number. A flip-flop 41 has a D input coupled to a terminal for receiving the n-bit binary input number and associated sign bit in serial two's complement code. Flip flops 41, 42, 43, 45, 46, 47, 48, 50 and 51 are series-connected with the Q output of each flip-flop being connected to a D input of a successive flip-flop of next lower rank. The Q output of flip-flop 51 is coupled to the second input of OR gate 23. The Q output of flip-flop 41 provides the sign bit of the binary input number and is coupled to the second input of AND gates 25, 27, 30, 32, 35, 37 and 40. In a preferred form, a reset signal is coupled to a reset terminal of each of the flip-flops 41, 42, 43, 45, 46, 47, 48, 50 and 51 although the reset signal is not needed to practice the invention. A clock signal is coupled to a clock input terminal of each of the flip-flops 41, 42, 43, 45, 46, 47, 48, 50 and 51.

Output portion 13 comprises a rank ordered plurality of flip-flops for latching and storing the output of logic means 11. A flip-flop 52 has a D input coupled to the Q output of flip-flop 41 and a Q output for providing the sign bit of the output binary number in sign-magnitude code. Flip-flop 53 has a D input coupled to the output of exclusive OR gate 15 and a Q output for providing the most significant magnitude bit of the output number. Flip-flops 55, 56, 57, 58, 60 and 61 each have a D input coupled to a respective output of exclusive OR gates 16, 17, 18, 20, 21 and 22. Flip-flop 62 has a D input coupled to both a Q output of flip-flop 51 and the second input of OR gate 23. Flip-flops 53, 55, 56, 57, 58, 60, 61 and 62 each have a Q output for providing a respective magnitude bit of the output binary number in sign-magnitude form. A latch enable signal is coupled to each of flip-flops 52, 53, 55, 56, 57, 58, 60, 61 and 62 for enabling each flip-flop to store the data present at its respective D input.

In operation, an input binary number in two's complement code is serially inputted and loaded into the flip-flops of input portion 12. A sign bit is stored in flip-flop 41 and n magnitude bits are stored in flip-flops 42, 43, 45, 46, 47, 48, 50 and 51. Once loaded, the LSB is directly coupled from flip-flop 51 to flip-flop 62. Similarly, the sign bit is directly coupled from flip-flop 41 to flip-flop 52. The sign bit is further utilized to allow logic portion 11 to identify the least significant bit of a negative number which has a logic one value and invert the remaining bits of higher significance.

Assume, for the purpose of illustration only, that the sign bit is a logic one value and that the number "100110111" in two's complement code has been loaded into input portion 12. The output of OR gate 23 is a logic one and the output of AND gate 25 is a logic one. The two inputs of exclusive OR gate 22 both have a logic one presented thereto thereby rendering the output stored in flip-flop 61 as a logic zero. Similarly, a carryover into OR gate 26 allows the output of AND gate 27 to be a logic one value. Since the second input of exclusive OR gate 21 also has a logic one presented thereto, the output of exclusive OR gate 21 is a logic zero. In a similar manner, a ripple carry propagates through logic portion 11 to the MSB of the output binary number. It can readily be shown that the resulting output for the given input number is "111001001" which is the sign-magnitude code of the input number. Exclusive OR gates 15, 16, 17, 18, 20, 21 and 22 function as "logical inverters". The output of exclusive OR gates 15, 16, 17, 18, 20, 21 and 22 can be logically expressed as:

$$O_i = Q_i \oplus [CI_{i-1} + Q_{i-1}] \cdot \text{SIGN},$$

for i=1 to n where the carry in input C$_I$ for OR gate 23 is established as a logic zero. Whenever another number is to be converted from two's complement code to sign-magnitude code, the number is loaded into input portion 12.

Assume that the number "100110100" in two's complement code has been loaded into input portion 12. It can be readily shown that the output of AND gates 25 and 27 are both a logic zero. Therefore, the least significant magnitude bit having a logic one value and all magnitude bits of lower significance are not inverted. Since a logic one level input is presented at the second input of OR gate 28, the output of OR gate 28 is thus a logic one. Because the second input of AND gate 30 is also a logic one, the output of AND gate 30 is a logic one, thereby causing the outputs of AND gates 32, 35, 37 and 40 to also be a logic one. Since exclusive OR gates 20, 18, 17, 16 and 15 have a logic one presented at each of the first inputs thereof, only exclusive OR gates 20, 18, 17 16 and 15 function as "logical inverters" and the output of each exclusive OR gate is the inverse of the signal present at the second input thereof. Therefore, it can readily be shown that the output word in sign-magnitude oode is "111001100".

By now it should be apparent that the invention may also be practiced without input portion 12 and output portion 13. Further, input portion 12 may be altered so that an input binary number may be loaded in parallel and coupled to logic portion 11. If desired, the output may be taken directly from logic means 11 and not latched by flip flops 52, 53, 55, 56, 57, 58, 60, 61 and 62. Since the LSB and sign bits are not inverted, a rapid conversion may be obtained within one cycle of a clock signal of predetermined frequency which is typically associated with a logic circuit system.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A code conversion circuit, for converting an n-bit binary number having a sign bit and n−1 magnitude bits in two's complement code to sign-magnitude code, where n is an integer, comprising:
   coupling means for directly outputting a least significant bit and the sign bit of the binary number in two's complement code; and
   a rank ordered plurality of logic gates for providing a plurality of rank ordered magnitude bit by outputting the remainder of said n−1 magnitude bits if said binary number is positive, and otherwise identifying the least significant bit of said n−1 magnitude bits having a logic one value and inverting only the remainder of said n−1 magnitude bits of higher significance before outputting the remainder of said n−1 magnitude bits, each of said plurality of logic gates comprising:
   first logic means having a first input coupled to a carry in signal indicative of the logic state of the magnitude bit of next lower significance, a second input coupled to a respective one of the n−1 magnitude bits of said binary number, and an output;
   second logic means having a first input coupled to the output of the first logic means, a second input coupled to the sign bit of the n-bit number, and an output; and
   third logic means having a first input coupled to the output of the second logic means, a second input coupled to the magnitude bit of next higher significance than the magnitude bit which the second input of the first logic means is coupled to, and an output, for providing a predetermined bit of the binary number in sign-magnitude code.

2. The code conversion circuit of claim 1 wherein said plurality of logic gates convert said n-bit binary number from two's complement code to sign-magnitude code within one cycle of a clock signal of predetermined frequency.

3. The code conversion circuit of claim 1 further comprising:
   input means coupled to said logic means for receiving the sign bit and n−1 magnitude bits of said n-bit binary number in two's complement code.

4. The code conversion circuit of claim 3 further comprising:
   output means coupled to both said input means and said plurality of logic gates, for storing said n-bit binary number in sign-magnitude code.

5. A circuit for converting an n-bit binary number having a sign bit and n−1 magnitude bits in a two's complement code to sign-magnitude code, where n is an integer, comprising:
   a rank ordered plurality of logic gates, the first of said logic gates providing a second least significant magnitude bit in sign-magnitude code, the last of said logic gates providing a most significant magnitude bit in sign-magnitude code, and each of the remainder of said logic gates providing a magnitude bit of predetermined significance in sign-magnitude code, each of said logic gates comprising:
   first logic means having a first input coupled to a carry in signal indicative of the logic state of the magnitude bits of lower significance, a second input coupled to a respective one of the n−1 magnitude bits of said binary number, and an output;
   second logic means having a first input coupled to the output of said first logic means, a second input coupled to the sign bit of said binary number and an output; and
   third logic means having a first input coupled to the output of said second logic means, a second input coupled to the magnitude bit of next higher significance than the magnitude bit which the second input of said first logic means is coupled to, and an output, for providing a predetermined bit of the binary number in sign-magnitude code; and
   coupling means for directly coupling the least significant bit and the sign bit of the binary number in two's complement code to a respective output terminal.

6. The circuit of claim 5 wherein said logic gates convert said n-bit binary number from two's complement code to sign-magnitude code within one cycle of a clock signal of predetermined frequency.

7. The circuit of claim 5 further comprising:
   input means coupled to both said rank ordered plurality of logic gates and coupling means, for receiving the sign bit and n−1 magnitude bits of said binary number in two's complement code.

8. The circuit of claim 5 further comprising:
   output means coupled to both said rank ordered plurality of logic gates and said coupling means, for storing said n-bit binary number in sign-magnitude code.

* * * * *